US012683578B2

(12) United States Patent
Ouchi

(10) Patent No.: US 12,683,578 B2
(45) Date of Patent: Jul. 14, 2026

(54) ACOUSTIC WAVE DEVICE INCLUDING ELECTRODES WITH DIFFERENT SURFACE ANGLES

(71) Applicant: Murata Manufacturing Co., Ltd., Nagaokakyo (JP)

(72) Inventor: Minefumi Ouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 506 days.

(21) Appl. No.: 18/108,074

(22) Filed: Feb. 10, 2023

(65) Prior Publication Data

US 2023/0198494 A1 Jun. 22, 2023

Related U.S. Application Data

(63) Continuation of application No. PCT/JP2021/030876, filed on Aug. 23, 2021.

(60) Provisional application No. 63/069,840, filed on Aug. 25, 2020.

(51) Int. Cl.
*H03H 9/13* (2006.01)

(52) U.S. Cl.
CPC ............ *H03H 9/132* (2013.01); *H03H 9/131* (2013.01)

(58) Field of Classification Search
CPC ...... H03H 9/02039; H03H 9/131; H03H 9/25; H03H 9/02157; H03H 9/175; H03H 9/02228; H03H 9/02015; H03H 9/132; H03H 9/174
USPC ......... 333/133, 186–188, 193–196; 310/311, 310/313
See application file for complete search history.

(56) References Cited

U.S. PATENT DOCUMENTS

| | | | |
|---|---|---|---|
| 6,707,229 B1 | 3/2004 | Martin | |
| 8,344,815 B2 | 1/2013 | Yamanaka | |
| 9,130,145 B2 | 9/2015 | Martin et al. | |
| 9,203,134 B1 * | 12/2015 | Henry | H03H 3/04 |

(Continued)

FOREIGN PATENT DOCUMENTS

| | | |
|---|---|---|
| CN | 116131802 A | 5/2023 |
| JP | 05243887 A | 9/1993 |

(Continued)

OTHER PUBLICATIONS

V. Plessky, S. Yandrapalli, P.J. Turner, L.G. Villanueva, J. Koskela, and R.B. Hammond, 5 GHz laterally-excited bulk-wave resonators (XBARs) based on thin platelets of lithium niobate, Electronics Letters, Jan. 24, 2019, vol. 55, No. 2, pp. 99-100. (Year: 2019).*

(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device includes a piezoelectric layer and a pair of electrodes. In a cross-section including first and second directions, at least one electrode of the pair of electrodes includes top, bottom, first side, and second side surfaces, the bottom surface being opposed to the top surface and closer to the piezoelectric layer than the top surface. A first angle between the first side surface and the first main surface is different from a second angle between the second side surface and the first main surface, and at least one of the first angle and the second angle is about 80° or larger.

19 Claims, 16 Drawing Sheets

(56) References Cited

U.S. PATENT DOCUMENTS

| | | | |
|---|---|---|---|
| 10,637,438 B2 | 4/2020 | Garcia et al. | |
| 10,826,462 B2 | 11/2020 | Plesski et al. | |
| 12,323,130 B2 * | 6/2025 | Garcia | H03H 9/02157 |
| 2006/0076851 A1 | 4/2006 | Fujimoto et al. | |
| 2006/0166451 A1 * | 7/2006 | Raskin | H01L 21/76254 |
| | | | 257/E21.568 |
| 2010/0102669 A1 | 4/2010 | Yamanaka | |
| 2010/0223999 A1 | 9/2010 | Onoe | |
| 2011/0199163 A1 | 8/2011 | Yamanaka | |
| 2013/0057360 A1 | 3/2013 | Meltaus et al. | |
| 2014/0145556 A1 | 5/2014 | Kadota | |
| 2014/0232239 A1 * | 8/2014 | Iwasaki | H03H 9/02984 |
| | | | 310/313 C |
| 2017/0077902 A1 | 3/2017 | Daimon | |
| 2019/0123721 A1 | 4/2019 | Takamine | |
| 2019/0386635 A1 | 12/2019 | Plesski et al. | |
| 2020/0021271 A1 | 1/2020 | Plesski | |
| 2021/0006228 A1 | 1/2021 | Garcia | |
| 2021/0013868 A1 | 1/2021 | Plesski et al. | |
| 2021/0408999 A1 | 12/2021 | Ito | |
| 2022/0231661 A1 | 7/2022 | Mchugh et al. | |

FOREIGN PATENT DOCUMENTS

| | | | | |
|---|---|---|---|---|
| JP | 2006109287 A | | 4/2006 |
| JP | 2010103803 A | | 5/2010 |
| JP | 2010233210 A | | 10/2010 |
| JP | 2012257019 A | | 12/2012 |
| JP | 2013528996 A | | 7/2013 |
| JP | 2018050135 A | * | 3/2018 |
| WO | 2010047114 A1 | | 4/2010 |
| WO | 2012137027 A1 | | 10/2012 |
| WO | 2013021948 A1 | | 2/2013 |
| WO | 2015182521 A1 | | 12/2015 |
| WO | 2018003273 A1 | | 1/2018 |
| WO | 2020095586 A1 | | 5/2020 |

OTHER PUBLICATIONS

International Search Report in PCT/JP2021/030876, mailed Nov. 2, 2021, 4 pages.

Written Opinion in PCT/JP2021/030876, mailed Nov. 2, 2021, 5 pages.

International Search Report and Written Opinion for PCT Application No. PCT/US2022/081095, mailed May 30, 2023, 12 pages.

* cited by examiner

| θ2 \ θ1 | 70° | 72.5° | 75° | 77.5° | 80° | 82.5° | 85° | 87.5° | 90° |
|---|---|---|---|---|---|---|---|---|---|
| 70° | B | B | B | B | A | A | A | A | A |
| 72.5° | B | B | B | A | A | A | A | A | A |
| 75° | B | B | A | A | A | A | A | A | A |
| 77.5° | B | A | A | A | A | A | A | A | A |
| 80° | A | A | A | A | A | A | A | A | A |
| 82.5° | A | A | A | A | A | A | A | A | A |
| 85° | A | A | A | A | A | A | A | A | A |
| 87.5° | A | A | A | A | A | A | A | A | A |
| 90° | A | A | A | A | A | A | A | A | A |
| 92.5° | A | A | A | A | A | A | A | A | A |
| 95° | A | A | A | A | A | A | A | A | A |
| 97.5° | A | A | A | A | A | A | A | A | A |
| 100° | A | A | A | A | A | A | A | A | A |

ACOUSTIC WAVE DEVICE INCLUDING ELECTRODES WITH DIFFERENT SURFACE ANGLES

CROSS REFERENCE TO RELATED APPLICATIONS

This application claims the benefit of priority to Provisional Application No. 63/069,840 filed on Aug. 25, 2020 and is a Continuation Application of PCT Application No. PCT/JP2021/030876 filed on Aug. 23, 2021. The entire contents of each application are hereby incorporated herein by reference.

BACKGROUND OF THE INVENTION

1. Field of the Invention

The present disclosure relates to an acoustic wave device including a piezoelectric layer including lithium niobate or lithium tantalate.

2. Description of the Related Art

Japanese Unexamined Patent Application Publication No. 2012-257019 describes an acoustic wave device.

In an acoustic wave device, there is a possibility that spurious responses may easily deteriorate the resonance characteristics of the acoustic wave device.

SUMMARY OF THE INVENTION

Preferred embodiments of the present invention provide acoustic wave devices that each reduce or prevent deterioration of resonance characteristics.

An acoustic wave device according to a preferred embodiment of the present disclosure includes a piezoelectric layer including a first main surface and a second main surface, the second main surface being opposed to the first main surface and being located in a first direction from the first main surface, and at least a pair of electrodes on the first main surface, facing each other in a second direction crossing the first direction, and adjacent to each other. In a cross section including the first direction and the second direction, at least one electrode of the pair of electrodes includes a top surface, a bottom surface, a first side surface, and a second side surface, the bottom surface being opposed to the top surface and being closer to the piezoelectric layer than the top surface. A first angle between the first side surface and the first main surface is different from a second angle between the second side surface and the first main surface, and at least one of the first angle and the second angle is about 80° or larger.

According to preferred embodiments of the present invention, deterioration of resonance characteristics is able to be reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a relationship between d/2$p$ and a fractional bandwidth as a resonator, where p is the center-to-center distance between adjacent electrodes in the acoustic wave device according to the first preferred embodiment of the present invention or the average distance of the center-to-center distances and d is the average thickness of the piezoelectric layer.

FIG. 18 is a table illustrating the ranges of the first angle θ1 and the second angle θ2 that satisfy evaluation criteria for values of Fspur/Fr in the case where the first angle θ1 is varied in the range of about 70° to about 90° and where the second angle θ2 is varied in the range of about 70° to about 100°.

DETAILED DESCRIPTION OF THE PREFERRED EMBODIMENTS

Preferred embodiments of the present invention will be described in detail below with reference to the drawings. The present disclosure is not limited to the preferred embodiments disclosed herein. The preferred embodiments described in the present disclosure are examples. In modifications in which the configurations according to the different preferred embodiments may be partially replaced with one another or may be combined with one another, the second preferred embodiment, and the subsequent preferred embodiments, descriptions of matters that are common with the first preferred embodiment will be omitted, and only differences will be described. In particular, the same or similar advantageous effects obtained with the same or similar configurations will not be described in every preferred embodiment.

First Preferred Embodiment

Figure 1A:
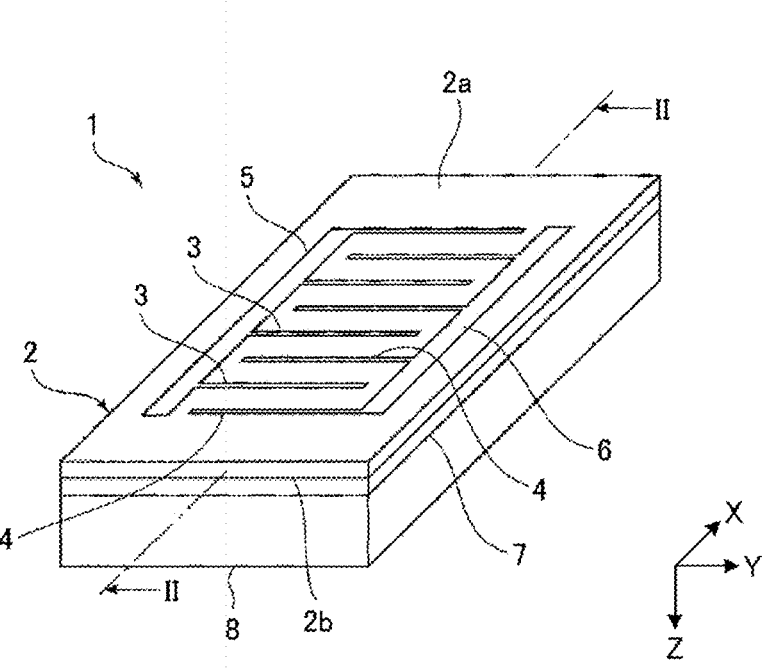
FIG. 1A is a perspective view illustrating an acoustic wave device according to a first preferred embodiment of the present invention.
Figure 1B:
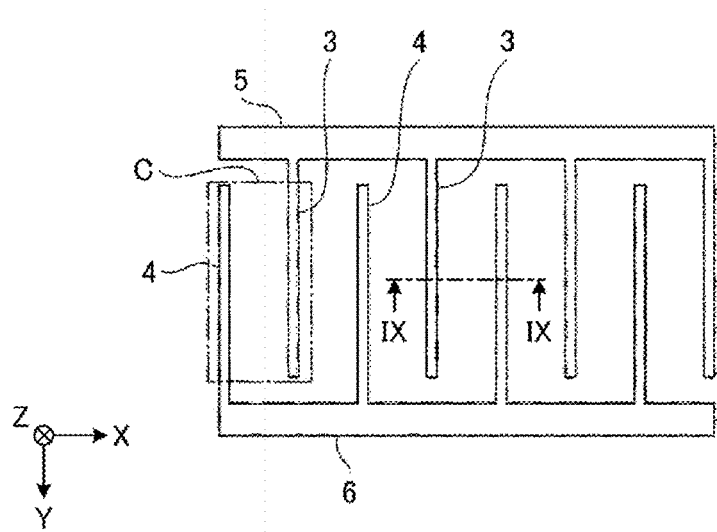
FIG. 1B is a plan view illustrating an electrode structure according to the first preferred embodiment of the present invention.

FIG. 1A is a perspective view illustrating an acoustic wave device according to a first preferred embodiment of the present invention. FIG. 1B is a plan view illustrating an electrode structure of the first preferred embodiment.

An acoustic wave device 1 according to the first preferred embodiment includes a piezoelectric layer 2 made of LiNbO₃, for example. The piezoelectric layer 2 may be made of, for example, LiTaO₃. Regarding the cut-angles of LiNbO₃ and LiTaO₃, Z cut is used in the first preferred embodiment. Alternatively, rotated Y-cut or X cut may be used. A propagation direction of, for example, about ±30° in Y propagation and X propagation is preferable.

Although the thickness of the piezoelectric layer 2 is not particularly limited, the thickness of the piezoelectric layer 2 is preferably, for example, about 50 nm or more and about 1,000 nm or less in order to effectively excite a thickness-shear primary mode.

The piezoelectric layer 2 includes a first main surface 2a and a second main surface 2b facing each other in a Z direction. Electrodes 3 and electrodes 4 are arranged on the first main surface 2a.

Here, each of the electrodes 3 is an example of a "first electrode", and each of the electrodes 4 is an example of a "second electrode". In FIGS. 1A and 1B, the plurality of electrodes 3 are connected to a first busbar 5. The plurality of electrodes 4 are connected to a second busbar 6. The plurality of electrodes 3 and the plurality of electrodes 4 are interdigitated with one another.

The electrodes 3 and the electrodes 4 each have a rectangular or substantially rectangular shape and each have a length direction. Each of the electrodes 3 and one of the electrodes 4 that is adjacent to the electrode 3 face each other in a direction perpendicular or substantially perpendicular to the length direction. The length direction of the electrodes 3 and 4 and the direction perpendicular or substantially perpendicular to the length direction of the electrodes 3 and 4 both cross the thickness direction of the piezoelectric layer 2. Accordingly, it can also be said that each of the electrodes 3 and the adjacent electrode 4 face each other in a direction crossing the thickness direction of the piezoelectric layer 2. In the first preferred embodiment, the thickness direction of the piezoelectric layer 2 will sometimes be referred to as the Z direction (or a first direction). The direction perpendicular or substantially perpendicular to the length direction of the electrodes 3 and 4 will sometimes be referred to as an X direction (or a second direction). The length direction of the electrodes 3 and 4 will sometimes be referred to as a Y direction (or a third direction).

In addition, the length direction of the electrodes 3 and 4 and a direction perpendicular or substantially perpendicular to the length direction of the electrodes 3 and 4 illustrated in FIGS. 1A and 1B are interchangeable. In other words, in FIGS. 1A and 1B, the electrodes 3 and 4 may extend in the direction in which the first busbar 5 and the second busbar 6 extend. In this case, the first busbar 5 and the second busbar 6 extend in the direction in which the electrodes 3 and 4 extend in FIGS. 1A and 1B. The electrodes 3 are connected to one potential, and the electrodes 4 are connected to another potential. Each of the electrodes 3 is paired with one of the electrodes 4 that is adjacent to the electrode 3, and these pairs of electrodes 3 and 4 are arranged in the direction perpendicular or substantially perpendicular to the length direction of the electrodes 3 and 4.

Here, when one of the electrodes 3 and the corresponding electrode 4 are adjacent to each other, the electrode 3 and the electrode 4 are arranged so as not to be in direct contact with each other but so as to be spaced apart from each other. In addition, when one of the electrodes 3 and the corresponding electrode 4 are adjacent to each other, electrodes including the other electrodes 3 and 4 that are connected to a hot electrode or a ground electrode are not located between the electrode 3 and the electrode 4. The number of the pairs does not need to be an integer and may be, for example, 1.5, 2.5, or the like.

It is preferable that the center-to-center distance between each pair of the electrodes 3 and 4, that is, the pitch of the electrodes 3 and 4, is, for example, within a range of about 1 μm or more to about 10 μm or less. The center-to-center distance between each pair of the electrodes 3 and 4 corresponds to the distance from the center of the width dimension of the electrode 3 in a direction perpendicular or substantially perpendicular to the length direction of the electrode 3 to the center of the width dimension of the electrode 4 in a direction perpendicular or substantially perpendicular to the length direction of the electrode 4.

In addition, in the case where at least one of the number of the electrodes 3 and the number of the electrodes 4 is two or more (when a single electrode 3 and a single electrode 4 define a pair of electrodes and the number of pairs of electrodes is 1.5 or more), the center-to-center distance between the electrode 3 and the electrode 4 refers to the average value of the center-to-center distances between the adjacent electrodes 3 and 4 included in the 1.5 or more pairs of electrodes.

The width of each of the electrodes 3 and 4, that is, a dimension of each of the electrodes 3 and 4 in the direction in which the electrodes 3 and 4 face one another, is preferably, for example, within a range of about 150 nm or more to about 1,000 nm or less. The center-to-center distance between each pair of the electrodes 3 and 4 corresponds to the distance from the center of a dimension (width dimension) of the electrode 3 in the direction perpendicular to the length direction of the electrode 3 to the center of a dimension (width dimension) of the electrode 4 in the direction perpendicular to the length direction of the electrode 4.

In the first preferred embodiment, a Z-cut piezoelectric layer is used, and thus, the direction perpendicular or substantially perpendicular to the length direction of the electrodes 3 and 4 is a direction perpendicular or substantially perpendicular to the polarization direction of the piezoelectric layer 2 unless a piezoelectric body having a different cut-angle is used as the piezoelectric layer 2. Here, the term "perpendicular" is not limited to referring to being exactly perpendicular and may refer to being substantially perpendicular (the angle formed by the direction perpendicular to the length direction of the electrodes 3 and 4 and the polarization direction is, for example, within a range of about 90°±10°).

Figure 2:
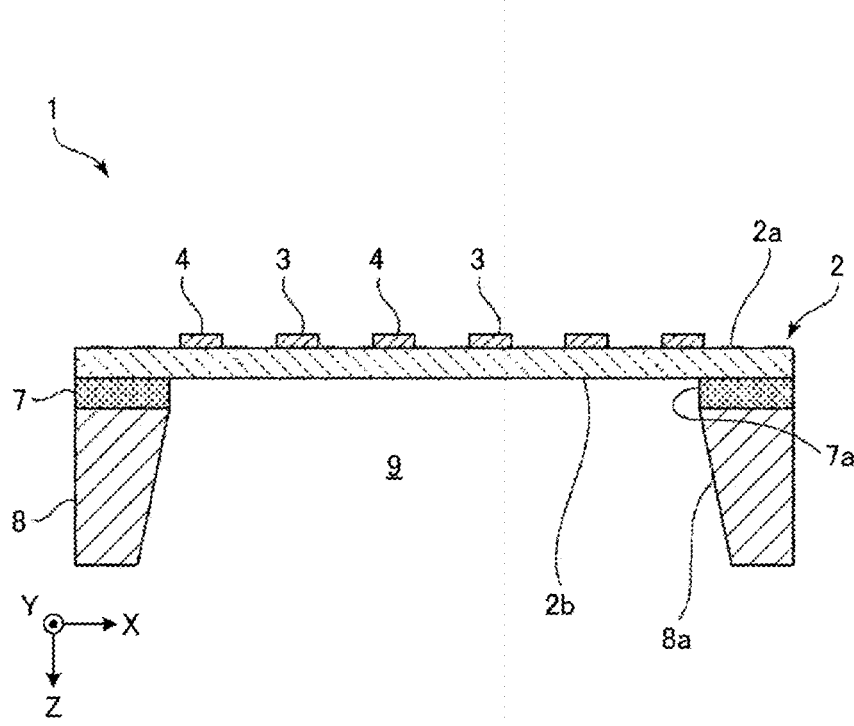
FIG. 2 is a sectional view taken along line II-II of FIG. 1A.

A support member 8 is stacked on the second main surface 2b of the piezoelectric layer 2 with an intermediate layer 7 interposed therebetween. The intermediate layer 7 and the support member 8 each have a frame shape, and as illustrated in FIG. 2, cavities 7a and 8a are respectively provided in the intermediate layer 7 and the support member 8. As a result, a hollow portion (an air gap) 9 is provided.

The hollow portion 9 is provided in order not to hinder vibration of an excitation region C of the piezoelectric layer 2. Thus, the support member 8 is stacked on the second main surface 2b with the intermediate layer 7 interposed therebetween and located at a position at which the support member 8 does not overlap a portion where at least one of the pairs of electrodes 3 and 4 are provided. The intermediate layer 7 does not need to be provided. Accordingly, the support member 8 may be stacked directly or indirectly on the second main surface 2b of the piezoelectric layer 2.

The intermediate layer 7 is an insulating layer and is made of, for example, a silicon oxide. However, the intermediate layer 7 may be made of a suitable insulating material such as, for example, silicon oxynitride or alumina other than a silicon oxide.

The support member 8 will also be referred to as a support substrate and is made of, for example, Si. The plane orientation of a surface of the Si, the surface facing the piezoelectric layer 2, may be (100) or (110) or may be (111). It is preferable that the Si has a high resistance, that is, a resistivity of, for example, about 4 kΩ or higher. The support member 8 may also be made of a suitable insulating material or a suitable semiconductor material, for example. Examples of the materials that can be used for the support member 8 include piezoelectric materials such as aluminum oxide, lithium tantalate, lithium niobate, and quartz crystal, various ceramic materials such as alumina, magnesia, sapphire, silicon nitride, aluminum nitride, silicon carbide, zirconia, cordierite, mullite, steatite, and forsterite, dielectric materials such as diamond and glass, and a semiconductor such as gallium nitride.

The plurality of electrodes 3 and 4 and the first and second busbars 5 and 6 are made of, for example, a suitable metal such as Al or a suitable alloy such as an AlCu alloy. In the first preferred embodiment, the electrodes 3 and 4 and the first and second busbars 5 and 6 each include, for example, an Al film laminated on a Ti film. A close-contact layer that is not a Ti film may be used.

When the acoustic wave device 1 is driven, an alternating-current voltage is applied between the plurality of electrodes 3 and the plurality of electrodes 4. More specifically, the alternating-current voltage is applied between the first busbar 5 and the second busbar 6. As a result, resonance characteristics using a bulk wave in the thickness-shear primary mode that is excited in the piezoelectric layer 2 can be obtained.

In the acoustic wave device 1, when the thickness of the piezoelectric layer 2 is denoted by d and the center-to-center distance between the adjacent electrodes 3 and 4 defining one of the pairs of electrodes 3 and 4 is denoted by p, d/p is about 0.5 or less, for example. Thus, the bulk wave in the thickness-shear primary mode is effectively excited, and favorable resonance characteristics can be obtained. More preferably, for example, d/p is about 0.24 or less, and in this case, more favorable resonance characteristics can be obtained.

As in the first preferred embodiment, in the case where at least one of the number of the electrodes 3 and the number of the electrodes 4 is two or more, that is, when a single electrode 3 and a single electrode 4 define a pair of electrodes and the number of pairs of electrodes is 1.5 or more, a center-to-center distance p between the adjacent electrodes 3 and 4 is the average distance of the center-to-center distances between the adjacent electrodes 3 and 4.

Since the acoustic wave device 1 of the first preferred embodiment has the above-described configuration, the Q value is less likely to decrease even if the number of the pairs of electrodes 3 and 4 is reduced so as to facilitate a reduction in the size of the acoustic wave device 1. The reason is that a propagation loss is small because of a resonator that does not need reflectors on both sides. No reflectors are needed as described above because the bulk wave in the thickness-shear primary mode is used.

Figure 3A:
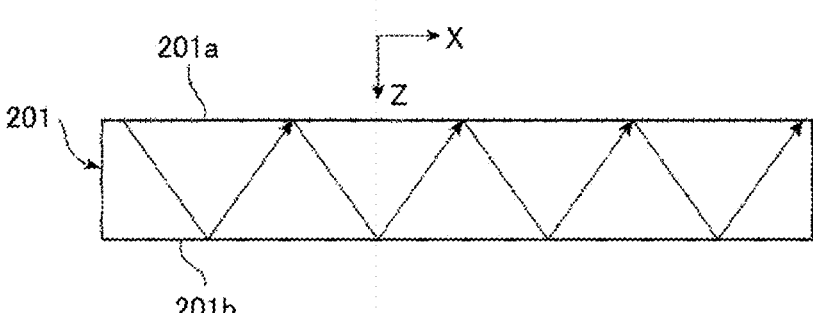
FIG. 3A is a schematic sectional view illustrating a Lamb wave propagating in a piezoelectric layer of a comparative example.
Figure 3B:
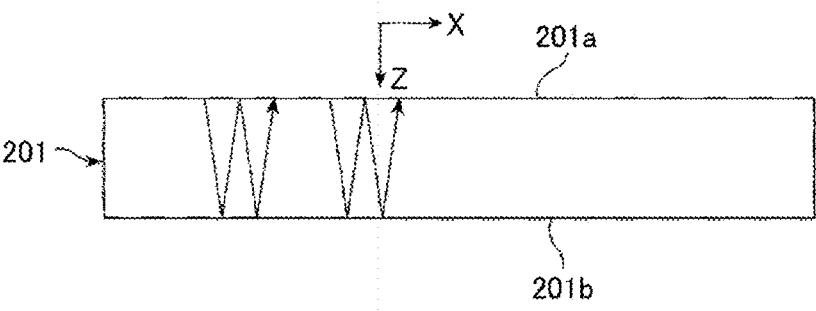
FIG. 3B is a schematic sectional view illustrating a bulk wave in a thickness-shear primary mode propagating in a piezoelectric layer according to the first preferred embodiment of the present invention.
Figure 4:
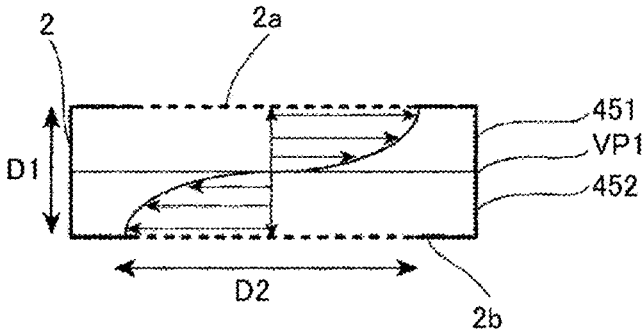
FIG. 4 is a schematic sectional view illustrating an amplitude direction of the bulk wave in the thickness-shear primary mode propagating in the piezoelectric layer according to the first preferred embodiment of the present invention.

FIG. 3A is a schematic sectional view illustrating a Lamb wave propagating in a piezoelectric layer of a comparative example. FIG. 3B is a schematic sectional view illustrating a bulk wave in the thickness-shear primary mode propagating in the piezoelectric layer of the first preferred embodiment. FIG. 4 is a schematic sectional view illustrating an amplitude direction of the bulk wave in the thickness-shear primary mode propagating in the piezoelectric layer of the first preferred embodiment.

FIG. 3A illustrates an acoustic wave device such as that described in Japanese Unexamined Patent Application Publication No. 2012-257019, and a Lamb wave propagates in a piezoelectric layer. As illustrated in FIG. 3A, a wave propagates in a piezoelectric layer 201 as indicated by arrows. Here, the piezoelectric layer 201 includes a first main surface 201a and a second main surface 201b, and a thickness direction connecting the first main surface 201a and the second main surface 201b to each other is the Z direction. The X direction is a direction in which electrode fingers of an IDT electrode are arranged. In the case of a Lamb wave, the wave propagates in the X direction as illustrated in FIG. 3A. Although the entire piezoelectric layer 201 vibrates because the lamb wave is a type of plate waves, since the wave propagates in the X direction, reflectors are provided on both sides so as to obtain resonance characteristics. Consequently, a propagation loss of the wave occurs, and if the size reduction is performed, that is, if the number of pairs of electrode fingers is reduced, the Q value decreases.

In contrast, as illustrated in FIG. 3B, in the acoustic wave device of the first preferred embodiment, vibration displacement occurs in a thickness shear direction, and thus, the wave substantially propagates and resonates in a direction connecting the first main surface 2a and the second main surface 2b of the piezoelectric layer 2 to each other, that is, the Z direction. In other words, an X-direction component of the wave is considerably smaller than a Z-direction component of the wave. The resonance characteristics are obtained as a result of the wave propagating in the Z direction, and thus, it is not necessary to provide reflectors. Accordingly, there will be no propagation loss that is generated when the wave propagates to reflectors. Therefore, even if the number of pairs of electrodes 3 and 4 is reduced so as to facilitate the size reduction, the Q value is less likely to decrease.

As illustrated in FIG. 4, the amplitude direction of the bulk wave in the thickness-shear primary mode in a first region 451 that is included in the excitation region C (see FIG. 1B) of the piezoelectric layer 2 is opposite to the amplitude direction of the bulk wave in the thickness-shear primary mode in a second region 452 that is included in the excitation region C. FIG. 4 schematically illustrates a bulk wave in the case where a voltage is applied between the electrodes 3 and 4, the voltage causing the potential of the electrode 4 to become higher than that of the electrode 3. The first region 451 is a region included in the excitation region C and is a region between a virtual plane VP1 and the first main surface 2a, the virtual plane VP1 being perpendicular or substantially perpendicular to the thickness direction of the piezoelectric layer 2 and dividing the piezoelectric layer 2 into two portions. The second region 452 is a region included in the excitation region C and is a region between the virtual plane VP1 and the second main surface 2b.

In the acoustic wave device 1, although at least one pair of electrodes 3 and 4 are provided, it does not cause a wave to propagate in the X direction, and thus, the number of pairs of the electrodes 3 and 4 does not need to be two or more. In other words, it is only necessary that at least one pair of electrodes is provided.

For example, the electrodes 3 are connected to the hot potential, and the electrodes 4 are connected to the ground potential. However, the electrodes 3 may be connected to the ground potential, and the electrodes 4 may be connected to the hot potential. In the first preferred embodiment, as described above, at least one pair of the electrodes are connected to the hot potential or electrodes connected to the ground potential, and no floating electrode is provided.

Figure 5:
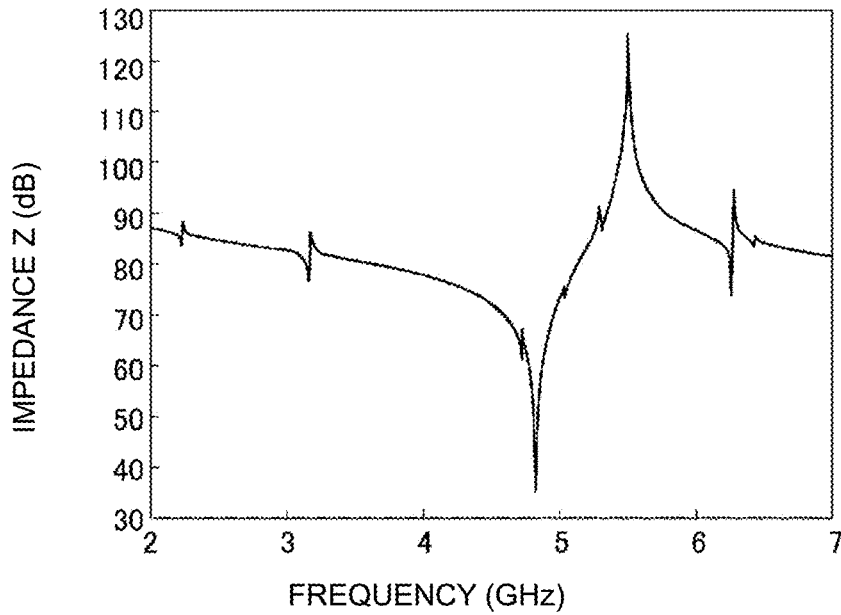
FIG. 5 is a graph illustrating exemplary resonance characteristics of the acoustic wave device according to the first preferred embodiment of the present invention.

FIG. 5 is a graph illustrating exemplary resonance characteristics of the acoustic wave device of the first preferred embodiment. Note that the design parameters of the acoustic wave device 1 that has obtained the resonance characteristics illustrated in FIG. 5 are as follows.

Piezoelectric layer 2: LiNbO₃ with Euler angles of (0°, 0°, 90°)

Thickness of piezoelectric layer 2=about 400 nm

Length of excitation region C (see FIG. 1B): about 40 μm

Number of pairs of electrodes 3 and 4: 21 pairs

Center-to-center distance (pitch) between electrodes 3 and 4: about 3 μm

Width of each of electrodes 3 and 4: about 500 nm d/p: about 0.133

Intermediate layer 7: silicon oxide film having a thickness of about 1 μm

Support member 8: Si

The excitation region C (see FIG. 1B) is a region in which one of the electrodes 3 and the corresponding electrode 4 overlap each other when viewed in the X direction perpendicular or substantially perpendicular to the length direction of the electrodes 3 and 4. The length of the excitation region C is a dimension of the excitation region C along the length direction of the electrodes 3 and 4.

In the first preferred embodiment, the electrode-to-electrode distances in the pairs of electrodes defined by the electrodes 3 and 4 were set to be the same or substantially the same as one another. In other words, the electrodes 3 and the electrodes 4 were arranged at the same or substantially the same pitch.

As is clear from FIG. 5, despite the fact that no reflectors are provided, a favorable resonance characteristic, which is a fractional bandwidth of about 12.5%, is obtained.

In the first preferred embodiment, d/p is, for example, about 0.5 or less and more preferably about 0.24 or less, where d is the thickness of the above-mentioned piezoelectric layer 2 and p is the center-to-center distance between each of the electrodes 3 and the corresponding electrode 4. This matter will now be described with reference to FIG. 6.

Figure 6:
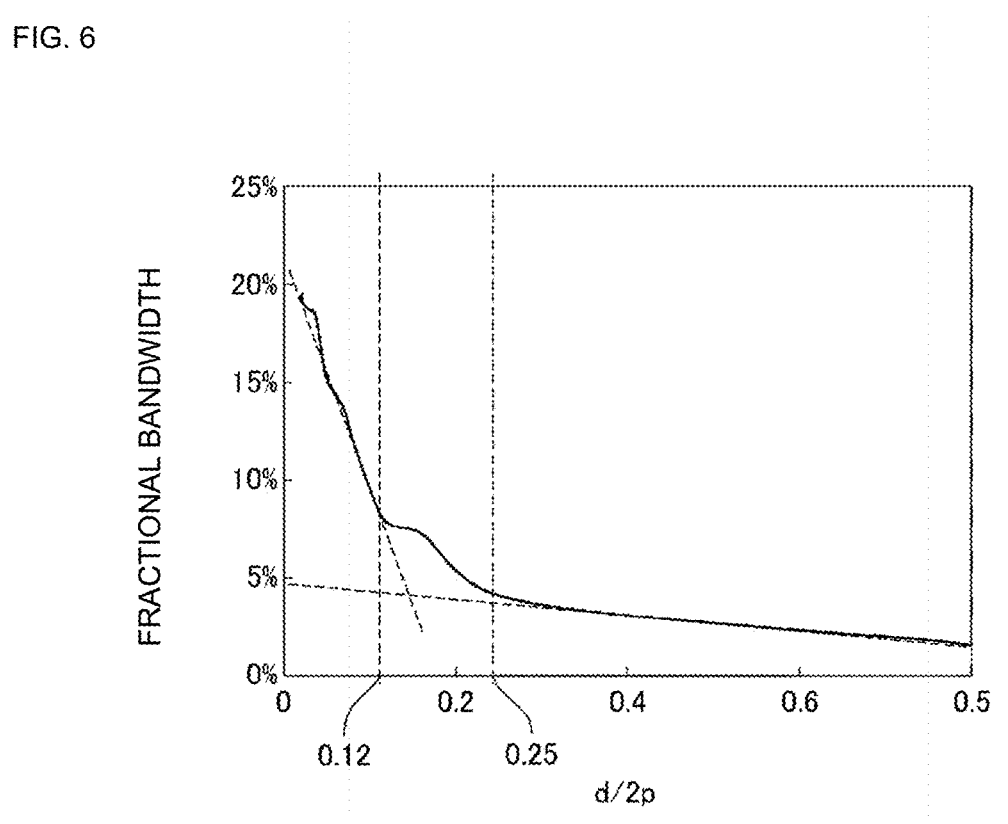

A plurality of acoustic wave devices were obtained in a manner similar to the acoustic wave device that obtained the resonance characteristics illustrated in FIG. 5 except that d/2p was varied. FIG. 6 is a graph illustrating a relationship between d/2p and a fractional bandwidth as a resonator, where p is the center-to-center distance between adjacent electrodes in the acoustic wave device of the first preferred embodiment or the average distance of the center-to-center distances and d is the average thickness of the piezoelectric layer.

As illustrated in FIG. 6, when d/2p exceeds about 0.25, that is, d/p>about 0.5, the fractional bandwidth is less than about 5% even if d/p is adjusted. In contrast, in the case of d/2p≤about 0.25, that is, d/p≤about 0.5, the fractional bandwidth can be about 5% or more by changing d/p within the range. In other words, a resonator having a high coupling coefficient can be provided. In addition, when d/2p is about 0.12 or less, that is, d/p is about 0.24 or less, the fractional bandwidth can be improved to about 7% or more. Furthermore, by adjusting d/p within this range, a resonator having an even wider fractional bandwidth can be obtained, and a resonator having an even higher coupling coefficient can be achieved. Thus, as in the second preferred embodiment of the present invention, it is understood that a resonator that uses the bulk wave in the thickness-shear primary mode and that has a high coupling coefficient can be provided by setting d/p to be about 0.5 or less.

At least one pair of the electrodes may be a single pair of the electrodes, and in this case, the p is the center-to-center distance between the adjacent electrodes 3 and 4. In addition, in the case where the number of pairs of the electrodes is 1.5 or more, p may be the average distance of the center-to-center distances between the adjacent electrodes 3 and 4.

In addition, if the piezoelectric layer 2 has a non-uniform thickness, a value obtained by averaging the thicknesses may be used as the thickness d of the piezoelectric layer.

Figure 7:
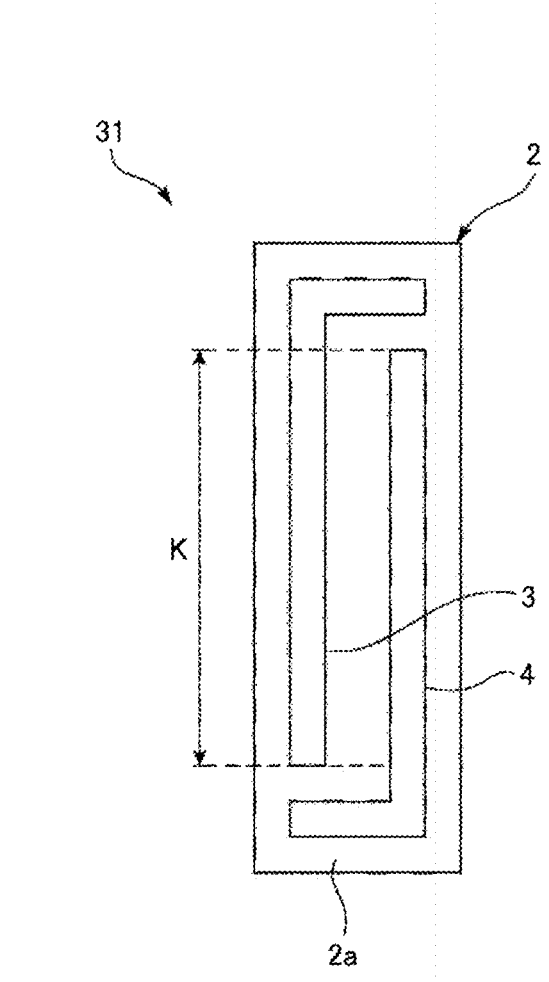
FIG. 7 is a plan view illustrating a case where a pair of electrodes are provided in the acoustic wave device according to the first preferred embodiment of the present invention.

FIG. 7 is a plan view illustrating a case where a pair of electrodes are provided in the acoustic wave device of the first preferred embodiment. In an acoustic wave device 31, a single pair of electrodes including one of the electrodes 3 and one of the electrodes 4 are provided on the first main surface 2a of the piezoelectric layer 2. An intersecting width is denoted by K in FIG. 7. As described above, the number of pairs of electrodes may be one. Also in this case, a bulk wave in the thickness-shear primary mode can be effectively excited as long as the d/p is about 0.5 or less.

Figure 8:
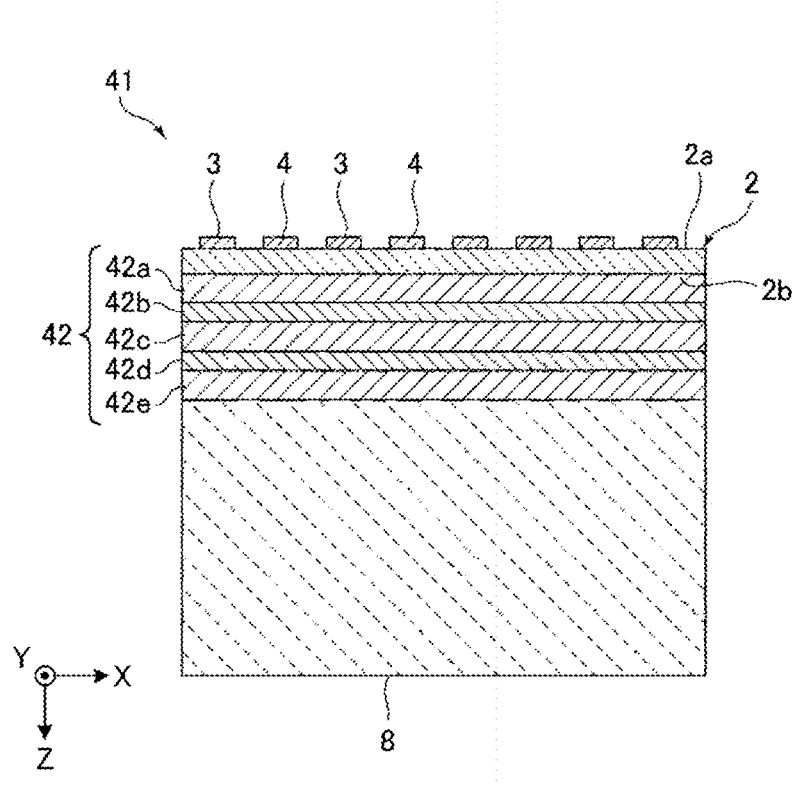
FIG. 8 is a sectional view of a portion of a modification of the first preferred embodiment of the present invention taken along line II-II of FIG. 1A.

FIG. 8 is a sectional view of a portion of a modification of the first preferred embodiment taken along line II-II of FIG. 1A. In an acoustic wave device 41, an acoustic multilayer film 42 is laminated on the second main surface 2b of the piezoelectric layer 2. The acoustic multilayer film 42 has a multilayer structure including low-acoustic-impedance layers 42a, 42c, and 42e each having a relatively low acoustic impedance and high-acoustic-impedance layers 42b and 42d each having a relatively high acoustic impedance. By using the acoustic multilayer film 42, the bulk wave in the thickness-shear primary mode can be confined within the piezoelectric layer 2 without using the hollow portion 9 of the acoustic wave device 1. Also in the acoustic wave device 41, by setting d/p to about 0.5 or less, resonance characteristics based on the bulk wave in the thickness-shear primary mode can be obtained. In the acoustic multilayer film 42, the number of the acoustic-impedance layers including the low-acoustic-impedance layers 42a, 42c, and 42e and the high-acoustic-impedance layers 42b and 42d laminated together is not particularly limited as long as at least one of the high-acoustic-impedance layers 42b and 42d is positioned farther from the piezoelectric layer 2 than each of the low-acoustic-impedance layers 42a, 42c, and 42e is.

The low-acoustic-impedance layers 42a, 42c, and 42e and the high-acoustic-impedance layers 42b and 42d can be made of a suitable material as long as they satisfy the above-described relationship. Examples of the material of the low-acoustic-impedance layers 42a, 42c, and 42e include a silicon oxide and silicon oxynitride. Examples of the material of the high-acoustic-impedance layers 42b and 42d include alumina, silicon nitride, and a metal.

As described above, in the acoustic wave devices 1, 31, and 41, the bulk wave in the thickness-shear primary mode is used. In addition, in the acoustic wave devices 1, 31, and 41, each of the first electrodes 3 is adjacent to one of the second electrodes 4, and d/p is 0.5 or less, where d is the thickness of the piezoelectric layer and p is the center-to-center distance between each of the first electrodes and the adjacent second electrode. As a result, the Q value can be improved even if the acoustic wave device is reduced in size.

In the acoustic wave devices 1, 31, and 41, the piezoelectric layer 2 is made of, for example, lithium niobate or lithium tantalate. The first electrodes 3 and the second electrodes 4 are provided on the first main surface 2a or the second main surface 2b of the piezoelectric layer 2 so as to face one another in a direction crossing the thickness direction of the piezoelectric layer 2.

Figure 9:
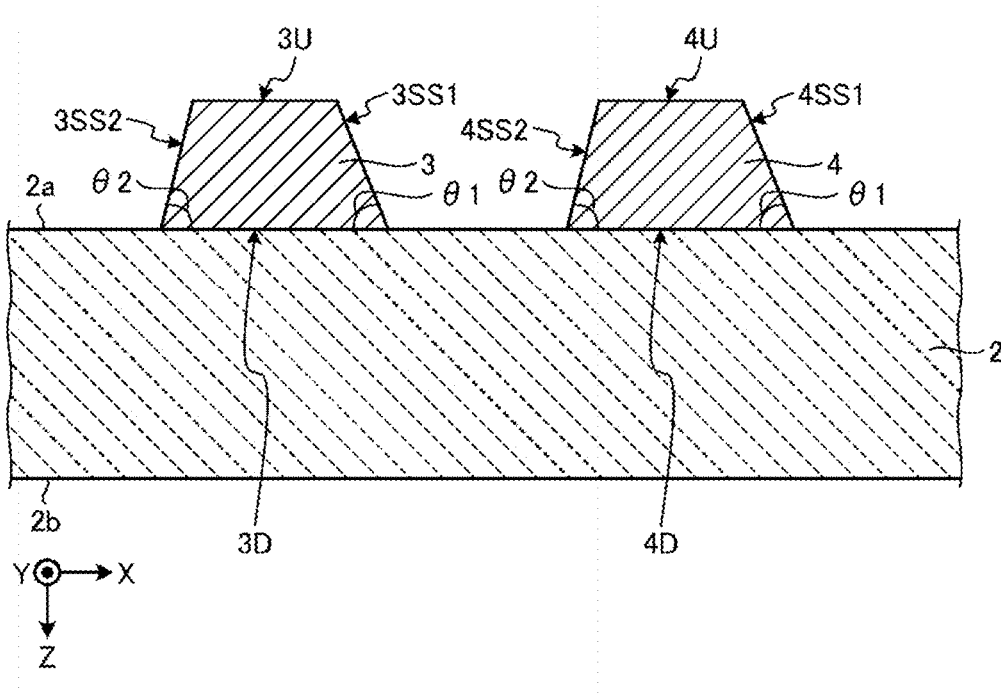
FIG. 9 is a sectional view taken along line IX-IX of FIG. 1B.

FIG. 9 is a sectional view taken along line IX-IX of FIG. 1B.

As illustrated in FIG. 9, each of the electrodes 3 includes a first surface 3U, a second surface 3D that is opposed to the first surface 3U and that is located on the side on which the piezoelectric layer 2 is provided, a first side surface 3SS1, and a second side surface 3SS2.

A first angle $\theta 1$ between the first main surface 2a of the piezoelectric layer 2 and the first side surface 3SS1 of each of the electrodes 3 is, for example, about 70° or larger and about 90° or smaller. A second angle $\theta 2$ between the first main surface 2a of the piezoelectric layer 2 and the second side surface 3SS2 of each of the electrodes 3 is, for example, about 80° or larger and about 110° or smaller. The first angle $\theta 1$ is different from the second angle $\theta 2$.

As illustrated in FIG. 9, each of the electrodes 4 includes a first surface 4U, a second surface 4D that is opposed to the first surface 4U and that is located on the side on which the piezoelectric layer 2 is provided, a first side surface 4SS1, and a second side surface 4SS2.

The first angle $\theta 1$ between the first main surface 2a of the piezoelectric layer 2 and the first side surface 4SS1 of each of the electrodes 4 is, for example, about 70° or larger and about 90° or smaller. The second angle $\theta 2$ between the first main surface 2a of the piezoelectric layer 2 and the second side surface 4SS2 of each of the electrodes 4 is, for example, about 80° or larger and about 110° or smaller. The first angle $\theta 1$ is different from the second angle $\theta 2$.

If there are different first angles $\theta 1$, the value obtained by averaging the first angles $\theta 1$ may be used. Similarly, if there are different second angles $\theta 2$, the value obtained by averaging the second angles $\theta 2$ may be used.

Figure 10:
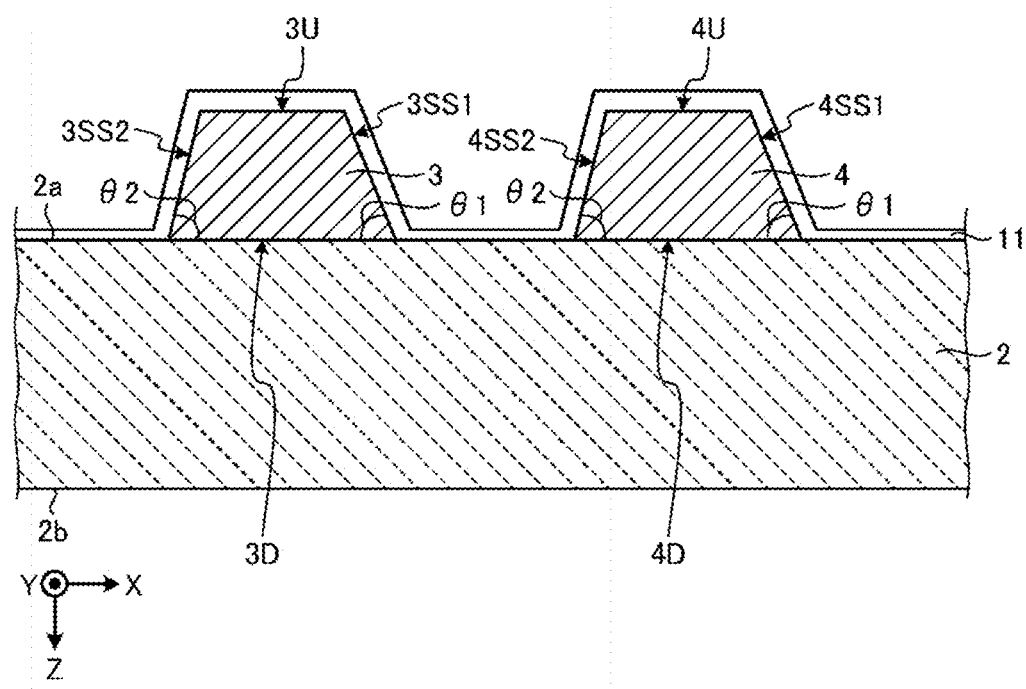
FIG. 10 is a sectional view of another example of the portion taken along line IX-IX in FIG. 1B.

It is preferable that a protective film covers the first electrodes 3 and the second electrodes 4 from above. FIG. 10 is a sectional view of another example of the portion taken along line IX-IX in FIG. 1B.

As illustrated in FIG. 10, a protective film 11 is made of, for example, silicon oxide. The protective film 11 may be made of, for example, silicon nitride as long as it is an inorganic insulating film. The protective film 11 may be a multilayer film including a silicon nitride film and a silicon oxide film. The protective film 11 includes, for example, silicon oxide or silicon nitride or includes both silicon oxide and silicon nitride. Components that are the same or substantially the same as those illustrated in FIG. 9 are denoted by the same reference signs, and detailed descriptions thereof will be omitted.

Figure 11:
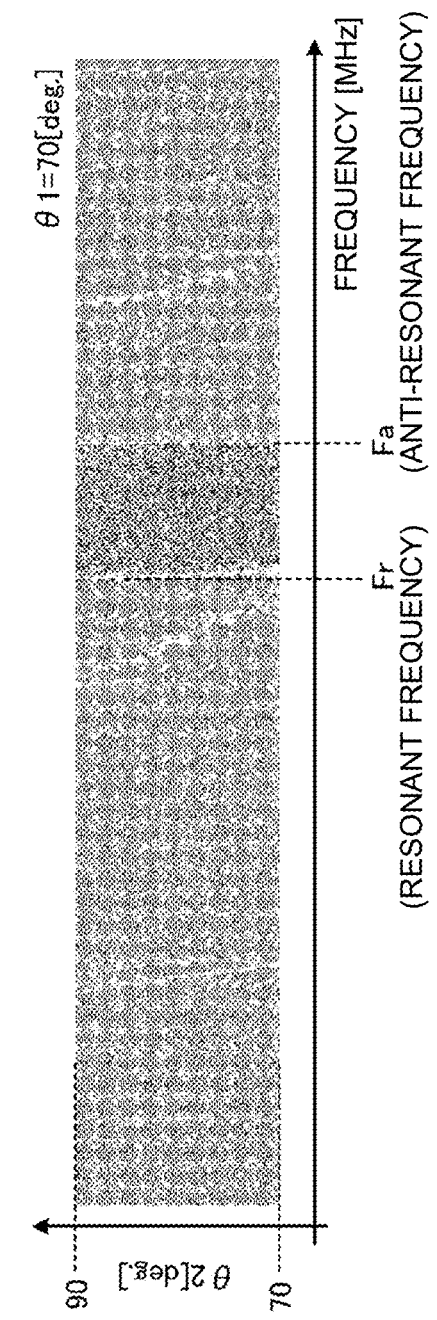
FIG. 11 is a diagram in which the intensities of a phase of resonance characteristics in the case where a first angle $\theta 1$ is about 70° and where a second angle $\theta 2$ is varied in a range of about 70° to about 90° are mapped for each frequency.

FIG. 11 is a diagram in which the intensities of a phase of resonance characteristics in the case where the first angle $\theta 1$ is about 70° and where the second angle $\theta 2$ is varied in a range of about 70° to about 90° are mapped for each frequency. As illustrated in FIG. 11, a phase within a pass band between a resonant frequency Fr and an anti-resonant frequency Fa approaches 90°, and thus, the area of the pass band is illustrated darker than frequency areas outside the pass band. A phase outside the pass band approaches −90°, and thus, areas outside the pass band are illustrated lighter than the pass band area. In addition, a phase shifts at a frequency at which a spurious response occurs, and thus, the color density is changed in accordance with the intensity of the spurious response so as to be distinguished from the color densities of the band area and the areas outside the band.

Figure 12:
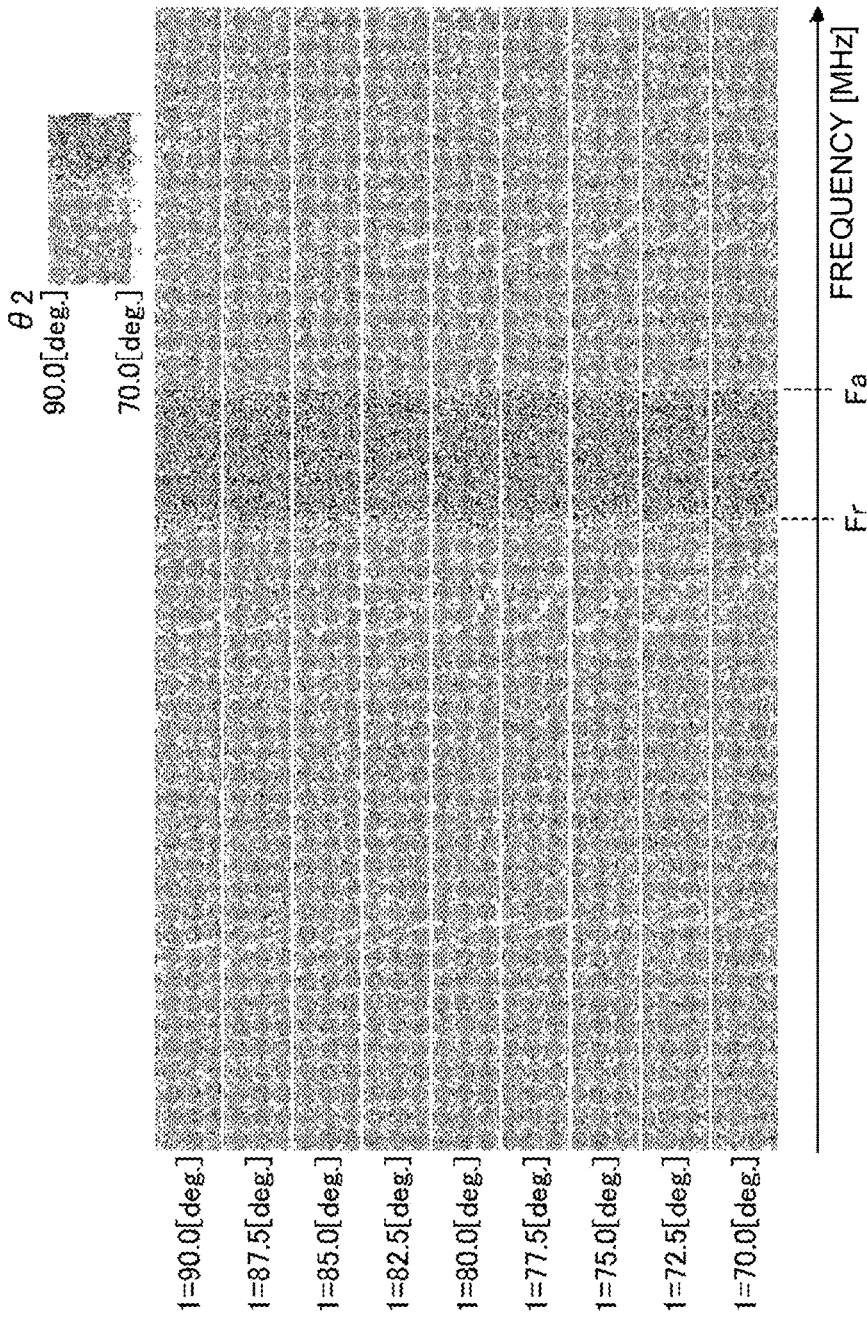
FIG. 12 is a diagram in which the intensities of the phase of the resonance characteristics in the case where the first angle $\theta 1$ and the second angle $\theta 2$ are varied in the range of about 70° to about 90° are mapped for each frequency and in which the mapping is performed for each time the first angle $\theta 1$ is changed by about 2.5° within the range of about 70° to about 90°.
Figure 13:
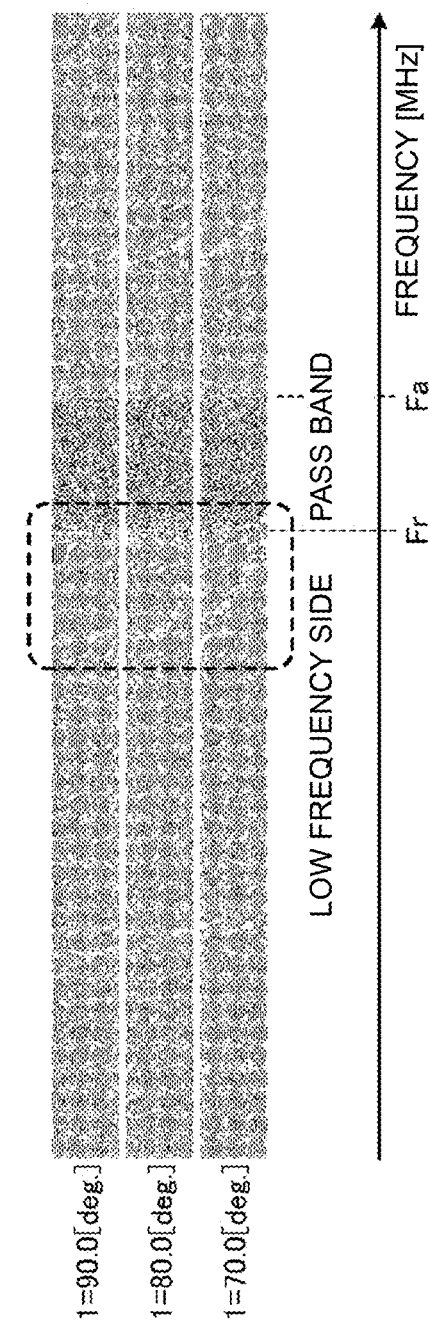
FIG. 13 is a diagram in which the intensities of the phase of the resonance characteristics in the case where the first angle $\theta 1$ and the second angle $\theta 2$ are varied in the range of about 70° to about 90° are mapped for each frequency and in which the mapping is performed when the first angle $\theta 1$ is about 70°, when the first angle $\theta 1$ is about 80°, and when the first angle $\theta 1$ is about 90°.

FIG. 12 is a diagram in which the intensities of the phase of the resonance characteristics in the case where the first angle $\theta 1$ and the second angle $\theta 2$ are varied in the range of about 70° to about 90° are mapped for each frequency and in which the mapping is performed for each time the first angle $\theta 1$ is changed by about 2.5° within the range of about 70° to about 90°. FIG. 13 is a diagram in which the intensities of the phase of the resonance characteristics in the case where the first angle $\theta 1$ and the second angle $\theta 2$ are varied in the range of about 70° to about 90° are mapped for each frequency and in which the mapping is performed when the first angle $\theta 1$ is about 70°, when the first angle $\theta 1$ is about 80°, and when the first angle $\theta 1$ is about 90°. Accordingly, FIG. 13 is a diagram formed by extracting the mapping results obtained when the first angle $\theta 1$ is about 70°, about 80°, and about 90° in FIG. 12.

As illustrated in FIG. 13, a spurious response is observed on the frequency side lower than the pass band. It is understood that spurious response variations that occur on the low frequency side of the pass band can be maintained smaller as the first angle $\theta 1$ becomes closer to about 90°.

Therefore, an adverse effect of a spurious response on the resonance characteristics can be reduced or prevented.

Figure 14:
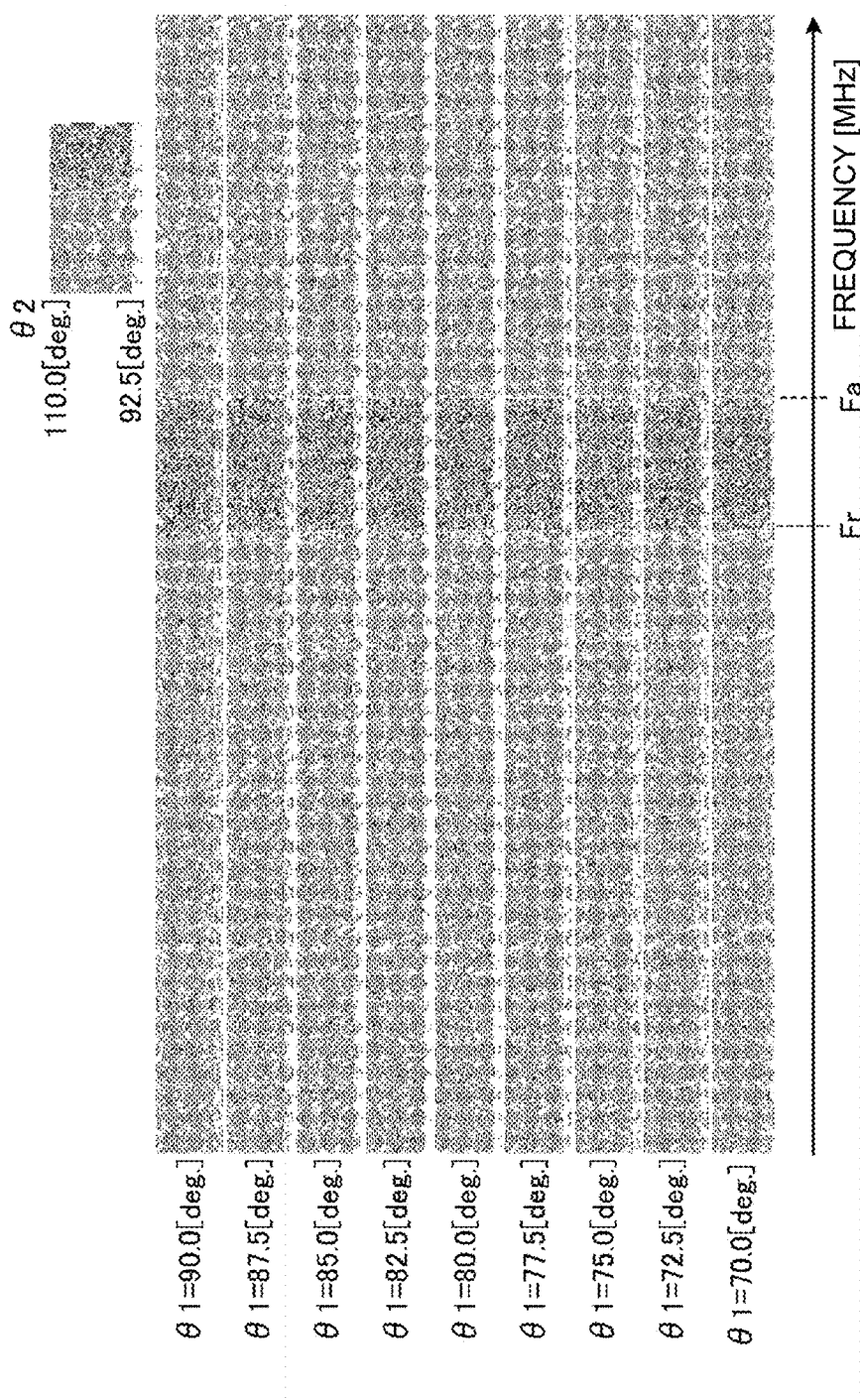
FIG. 14 is a diagram in which the intensities of the phase of the resonance characteristics in the case where the first angle $\theta 1$ is varied in the range of about 70° to about 90° and where the second angle $\theta 2$ is varied in a range of about 92.5° to about 110° are mapped for each frequency and in which the mapping is performed for each time the first angle $\theta 1$ is changed by about 2.5° within the range of about 70° to about 90°.
Figure 15:
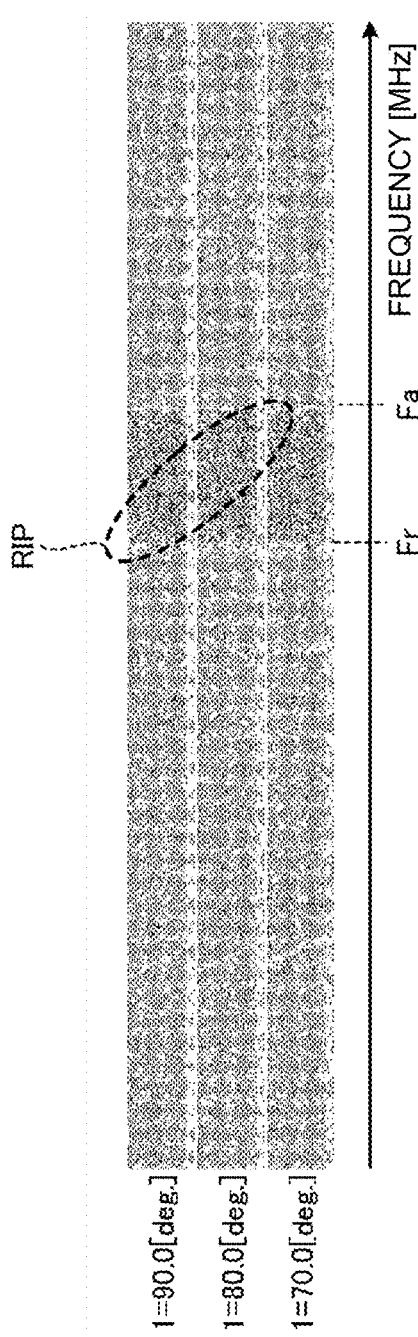
FIG. 15 is a diagram in which the intensities of the phase of the resonance characteristics in the case where the first angle $\theta 1$ is varied in the range of about 70° to about 90° and where the second angle θ2 is varied in a range of about 92.5° to about 110° are mapped for each frequency and in which the mapping is performed when the first angle θ1 is about 70°, when the first angle θ1 is about 80°, and when the first angle θ1 is about 90°.

FIG. 14 is a diagram in which the intensities of the phase of the resonance characteristics in the case where the first angle θ1 is varied in the range of about 70° to about 90° and where the second angle θ2 is varied in a range of about 92.5° to about 110° are mapped for each frequency and in which the mapping is performed for each time the first angle θ1 is changed by about 2.5° within the range of about 70° to about 90°. FIG. 15 is a diagram in which the intensities of the phase of the resonance characteristics in the case where the first angle θ1 is varied in the range of about 70° to about 90° and where the second angle θ2 is varied in a range of about 92.5° to about 110° are mapped for each frequency and in which the mapping is performed when the first angle θ1 is about 70°, when the first angle θ1 is about 80°, and when the first angle θ1 is about 90°. Accordingly, FIG. 15 is a diagram formed by extracting the mapping results obtained when the first angle θ1 is about 70°, about 80°, and about 90° in FIG. 14.

As illustrated in FIG. 15, it is understood that a large ripple RIP appears in the pass band when the second angle θ2 exceeds 100°. Thus, it is preferable that the second angle θ2 is, for example, about 100° or smaller. When comparing FIG. 12 and FIG. 14, it is more preferable that the second angle θ2 is, for example, about 90° or smaller.

Figure 16:
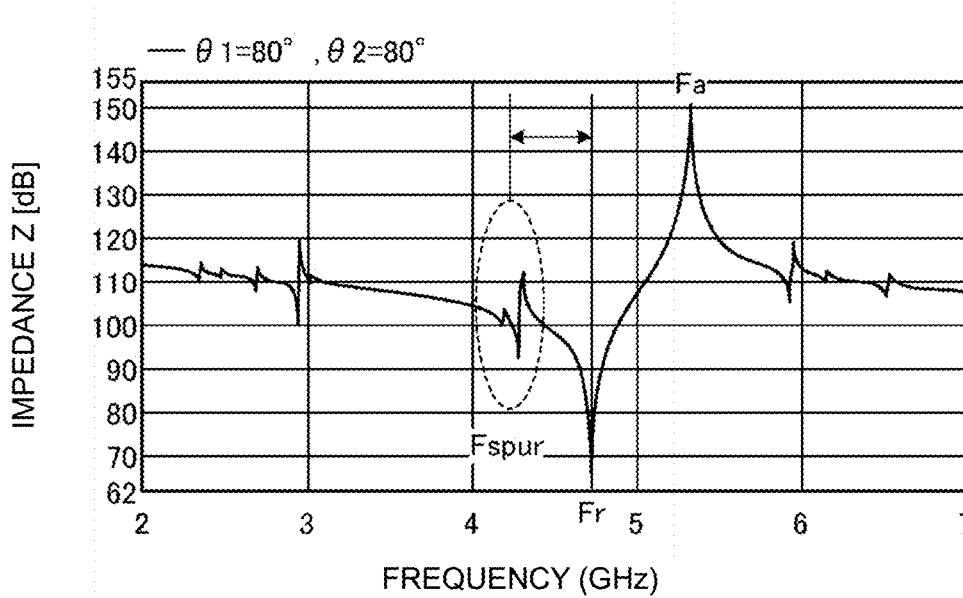
FIG. 16 is a graph illustrating a relationship between a frequency of spurious and a resonant frequency in the case where the first angle θ1 and the second angle θ2 are about 80°.

FIG. 16 is a graph illustrating a relationship between a frequency of spurious and a resonant frequency in the case where the first angle θ1 and the second angle θ2 are about 80°. Here, as illustrated in FIG. 16, it is preferable that a frequency Fspur at which a spurious response occurs does not interfere with the pass band.

Thus, it is more preferable that the frequency Fspur which is illustrated in FIG. 11 and at which a spurious response occurs is away from the resonant frequency Fr. Since a spurious response does not interfere with the pass band, the inventor of preferred embodiments of the present invention has discovered that it is necessary to separate the frequency Fspur, at which a spurious response occurs, from the resonant frequency Fr by the resonant frequency Fr (MHz)×5% or more. In this case, when Fspur/Fr about 0.95, a spurious response is less likely to interfere in the pass band.

Figure 17:
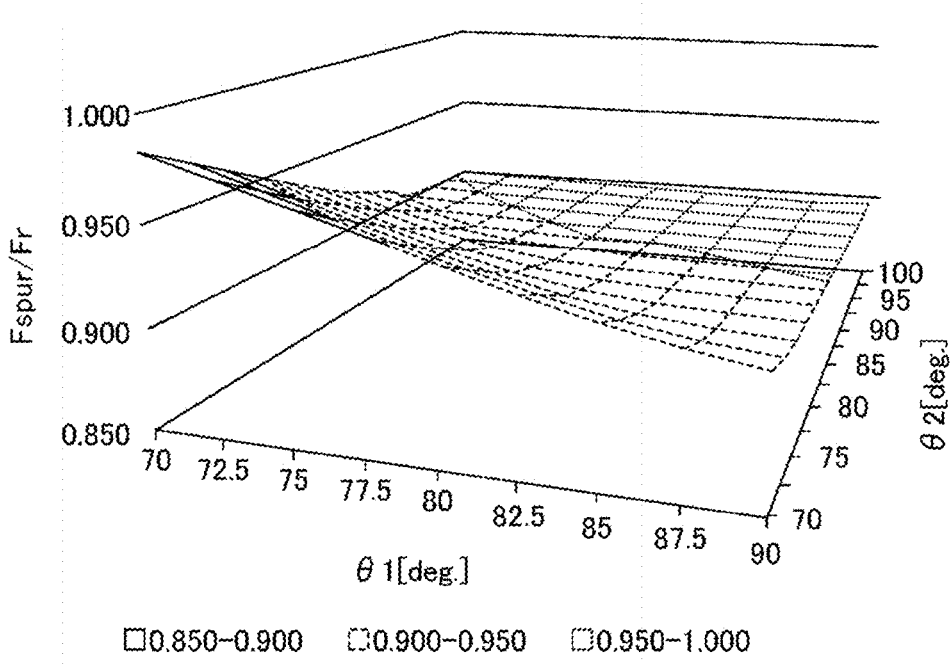
FIG. 17 is a diagram in which values of Fspur/Fr in the case where the first angle θ1 is varied in the range of about 70° to about 90° and where the second angle θ2 is varied in a range of about 70° to about 100° are mapped for each matrix of the first angle θ1 and the second angle θ2.

For example, among the evaluation conditions under which simulation evaluation results illustrated in FIG. 16 were obtained while the resonant frequency was about 4,740 MHz and the frequency Fspur, at which spurious occurs, was about 4,302 MHz, the first angle θ1 and the second angle θ2 were respectively varied in the range of about 70° to about 90° and in the range of about 70° to about 100°, and recalculations and evaluations were performed. FIG. 17 and FIG. 18 illustrate the evaluation results.

Figure 19:
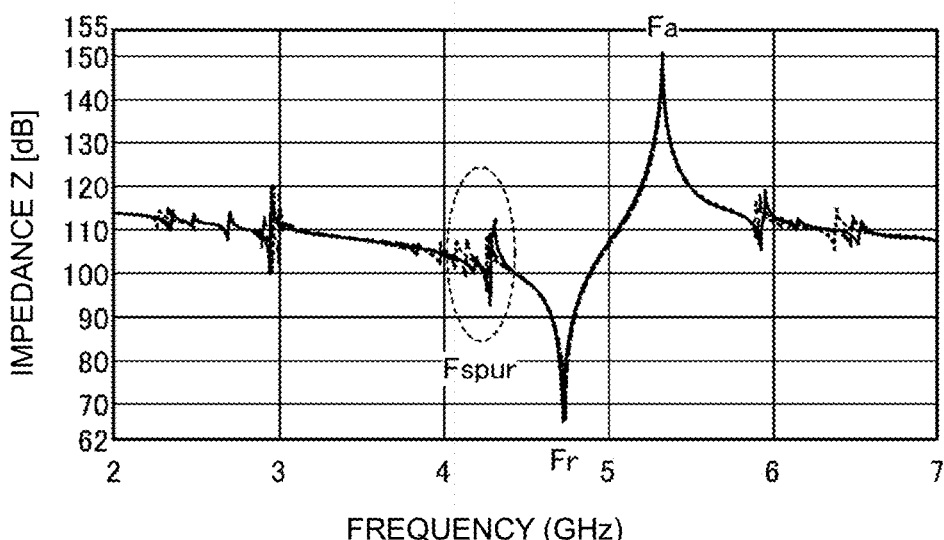
FIG. 19 is a graph illustrating a relationship between a frequency of a spurious response and a resonant frequency in each of first to third examples.

FIG. 17 is a diagram in which values of Fspur/Fr in the case where the first angle θ1 is varied in the range of about 70° to about 90° and where the second angle θ2 is varied in the range of about 70° to about 100° are mapped for each matrix of the first angle θ1 and the second angle θ2. FIG. 18 is a table illustrating the ranges of the first angle θ1 and the second angle θ2 that satisfy evaluation criteria for values of Fspur/Fr in the case where the first angle θ1 is varied in the range of about 70° to about 90° and where the second angle θ2 is varied in the range of about 70° to about 100°. FIG. 19 is a graph illustrating a relationship between a frequency of spurious and a resonant frequency in each of first to third examples. In the first example, the first angle θ1 is about 80°, and the second angle θ2 is about 80°. In the second example, the first angle θ1 is about 75°, and the second angle θ2 is about 90°. In the third example, the first angle θ1 is about 70°, and the second angle θ2 is about 100°.

The evaluation result is A when Fspur/Fr is about 0.95 or less and the evaluation criteria are satisfied. The evaluation result is B when Fspur/Fr exceeds about 0.95 and the evaluation criteria are not satisfied. It is understood from the Table illustrated in FIG. 18 that, when the second angle θ2 is set to about 80° or larger with about 70°≤θ1≤about 90°, the following Formula (1) is satisfied, and a spurious response is less likely to affect the characteristics within the pass band. In addition, when the first angle θ1 and the second angle θ2 are both about 80° or larger, the following Formula (1) can be stably satisfied, and thus, a spurious response is further less likely to affect the characteristics within the pass band. As described above, and as illustrated in FIG. 17 and FIG. 18, the evaluation criteria can be satisfied when at least one of the first angle θ1 and the second angle θ2 is about 80° or larger.

$$Fspur/Fr≤0.95 \tag{1}$$

As described above, the acoustic wave device 1 includes the piezoelectric layer 2 and at least one pair of the electrodes 3 and 4 that face each other in the X direction crossing the Z direction and that are arranged on the first main surface 2a so as to be adjacent to each other. In a cross section including the Z direction and the X direction, the pair of electrodes 3 and 4 include the first surfaces 3U and 4U (the top surfaces), the second surfaces 3D and 4D (the bottom surfaces) that are opposed to the first surfaces 3U and 4U (the top surfaces) and that are located on the side on which the piezoelectric layer 2 is provided, the first side surfaces 3SS1 and 4SS1, and the second side surfaces 3SS2 and 4SS2.

The first angle θ1 defined by each of the first side surfaces 3SS1 and 4SS1 and the first main surface 2a is different from the second angle θ2 formed by each of the second side surfaces 3SS2 and 4SS2 and the first main surface 2a, and at least one of the first angle θ1 and the second angle θ2 is about 80° or larger.

In the acoustic wave device described in Japanese Unexamined Patent Application Publication No. 2012-257019, if the angle between a first side surface of an electrode and a main surface of a piezoelectric layer varies, there is a possibility that the influence of a spurious response may occur. However, a restriction that the angle between one of the two side surfaces of the electrode and the main surface of the piezoelectric layer and the angle between the other side surface of the electrode and the main surface of the piezoelectric layer are the same or substantially the same as each other in the acoustic wave device causes deterioration of the yield of the acoustic wave device. In contrast, the acoustic wave device of the first preferred embodiment can reduce or prevent the intensity of a spurious response and deterioration of the resonance characteristics even if the first angle θ1 and the second angle θ2 are different from each other.

In each of the acoustic wave devices 1, 31, and 41, the bulk wave in the thickness-shear primary mode is used. As a result, the coupling coefficient is improved, and an acoustic wave device capable of obtaining favorable resonance characteristics can be provided.

The first and second electrodes 3 and 4 are the electrodes that are adjacent to each other, and d/p is set to about 0.5 or less, for example, where d is the thickness of the piezoelectric layer and p is the center-to-center distance between the first and second electrodes. As a result, the acoustic wave device can be reduced in size, and the Q value can be improved.

As a preferable feature, for example, the first angle θ1 is about 70° or larger and about 90° or smaller, and the second angle θ2 is about 80° or larger. This separates the frequency Fspur, at which a spurious response occurs, from the resonant frequency Fr, and deterioration of the resonance characteristics can be suppressed.

As a preferable feature, the first angle θ1 is about 70° or larger and is smaller than about 80°, and the second angle θ2 is about 80° or larger. This further separates the frequency Fspur, at which a spurious response occurs, from the resonant frequency Fr, and deterioration of the resonance characteristics can be further suppressed.

As a preferable feature, the second angle θ2 is about 80° or larger and 1 about 100° or smaller. This can reduce or prevent the occurrence of the ripple RIP in the pass band.

As a preferable feature, the acoustic wave device 1 further includes the protective film 11 that covers the first main surface 2a of the piezoelectric layer 2 and the electrodes 3 and 4. The protective film 11 is made of, for example, at least one material selected from the group consisting of silicon oxide and silicon nitride. As a result, the electrodes 3 and 4 and the piezoelectric layer 2 can be protected.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric layer including a first main surface, and a second main surface opposed to the first main surface and located in a first direction from the first main surface; and
at least a pair of electrodes on the first main surface, facing each other in a second direction crossing the first direction, and adjacent to each other; wherein
in a cross section including the first direction and the second direction, at least one electrode of the pair of electrodes includes a top surface, a bottom surface, a first side surface, and a second side surface, the bottom surface being opposed to the top surface and being closer to the piezoelectric layer than the top surface is;
a first angle between the first side surface and the first main surface is different from a second angle between the second side surface and the first main surface;
at least one of the first angle and the second angle is about 80° or larger; and
the first angle is at an intersection of the first side surface and the first main surface, and the second angle is at an intersection of the second side surface and the first main surface.

2. The acoustic wave device according to claim 1, wherein the piezoelectric layer includes lithium niobate or lithium tantalate; and
a bulk wave in a thickness-shear primary mode is utilized.

3. The acoustic wave device according to claim 1, wherein
the piezoelectric layer includes lithium niobate or lithium tantalate; and
d/p is about 0.5 or less, where d is an average thickness of the piezoelectric layer and p is a center-to-center distance between adjacent electrodes.

4. The acoustic wave device according to claim 1, wherein the first angle is about 70° or larger and about 90° or smaller, and the second angle is about 80° or larger.

5. The acoustic wave device according to claim 1, wherein the first angle is about 70° or larger and about 80° or smaller, and the second angle is about 80° or larger.

6. The acoustic wave device according to claim 4, wherein the second angle is about 80° or larger and about 100° or smaller.

7. The acoustic wave device according to claim 1, further comprising:
a protective film covering the first main surface of the piezoelectric layer and the electrodes; wherein
the protective film includes at least one of silicon oxide or silicon nitride.

8. The acoustic wave device according to claim 3, wherein d/p is about 0.24 or less.

9. The acoustic wave device according to claim 1, wherein a thickness of the piezoelectric layer is about 50 nm or more and about 1,000 nm or less.

10. The acoustic wave device according to claim 1, wherein each of the electrodes has a rectangular or substantially rectangular shape.

11. The acoustic wave device according to claim 3, wherein the center-to-center distance between adjacent electrodes is about 1 μm or more to about 10 μm or less.

12. The acoustic wave device according to claim 1, wherein a width of each of the electrodes is about 150 nm or more to about 1,000 nm or less.

13. The acoustic wave device according to claim 1, wherein a support is provided on the second main surface of the piezoelectric layer with an intermediate layer interposed therebetween.

14. The acoustic wave device according to claim 13, wherein each of the support and the intermediate layer has a frame shape and includes a cavity therein.

15. The acoustic wave device according to claim 13, wherein the intermediate layer includes silicon oxide.

16. The acoustic wave device according to claim 13, wherein the support includes Si.

17. The acoustic wave device according to claim 16, wherein the Si has a resistivity of about 4 kΩ or higher.

18. The acoustic wave device according to claim 1, wherein each of the electrodes includes at least one of Al or an AlCu alloy.

19. The acoustic wave device according to claim 1, wherein each of the electrodes includes an Al film laminated on a Ti film.

* * * * *